(12) United States Patent
Aoki et al.

(10) Patent No.: US 6,597,021 B2
(45) Date of Patent: Jul. 22, 2003

(54) PROTECTION CIRCUIT AND SEMICONDUCTOR DEVICE

(75) Inventors: Eiji Aoki, Yamatokoriyama (JP); Hidechika Kawazoe, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/984,923

(22) Filed: Oct. 31, 2001

(65) Prior Publication Data

US 2002/0074608 A1 Jun. 20, 2002

(30) Foreign Application Priority Data

Oct. 31, 2000 (JP) ........................................ 2000-334018

(51) Int. Cl.[7] .......................... H01L 29/74; H01L 23/62
(52) U.S. Cl. ...................... 257/173; 257/355; 257/356; 257/174; 257/357; 257/358; 257/359
(58) Field of Search ................................ 257/173, 355, 257/356, 357, 358, 359, 360, 363, 365, 174; 361/205, 207, 91.1, 91.2, 91.8, 93.9

(56) References Cited

U.S. PATENT DOCUMENTS

| | | | | |
|---|---|---|---|---|
| 5,051,860 A | * | 9/1991 | Lee et al. ...................... | 257/358 |
| 5,610,425 A | * | 3/1997 | Quigley et al. ................ | 257/111 |
| 6,130,117 A | * | 10/2000 | Walker et al. ............... | 438/133 |

FOREIGN PATENT DOCUMENTS

| | | | | |
|---|---|---|---|---|
| EP | 0491543 | * | 12/1991 | ......... H01L/23/538 |
| JP | 10-70238 | | 3/1998 | |

* cited by examiner

Primary Examiner—Minh Loan Tran
Assistant Examiner—Tan Tran
(74) Attorney, Agent, or Firm—Birch, Stewart, Kolasch & Birch, LLP

(57) ABSTRACT

A protection circuit for protecting a semiconductor device from being damaged due to an excessively high applied voltage, includes a P-type MOS transistor provided between an external input-output terminal and a power supply line, an N-type MOS transistor provided between the P-type MOS transistor and a ground line, a first thyristor provided between the external input-output terminal and the ground line, the anode portion being connected to the external input-output terminal side, and the cathode portion being connected to the ground line, a second thyristor provided between the power supply line and the ground line, the anode portion being connected to the power supply line, and the cathode portion being connected to the ground line, and a resistance portion provided at a predetermined location of a conductor extending from a branch node between the P-type and N-type MOS transistors to the power supply line via the P-type MOS transistor.

12 Claims, 9 Drawing Sheets

PROTECTION CIRCUIT AND SEMICONDUCTOR DEVICE

BACKGROUND OF THE INVENTION

1. Field of the Invention

The present invention relates to a protection circuit for use in protection of a MIS semiconductor device fabricated using a CMOS process from a semiconductor device from an excessively high voltage, and a semiconductor device including a protection circuit.

2. Description of the Related Art

Semiconductor devices fabricated with a CMOS process are generally less resistant to static electricity. In order to protect a semiconductor device from being damaged by static electricity, a protection circuit is typically provided at an external input-output terminal of the semiconductor device. A thyristor is widely used in such a protection circuit. A thyristor is a semiconductor device including two or more PN junctions. A fundamental structure of a thyristor is shown in FIG. 1.

Figure 1:
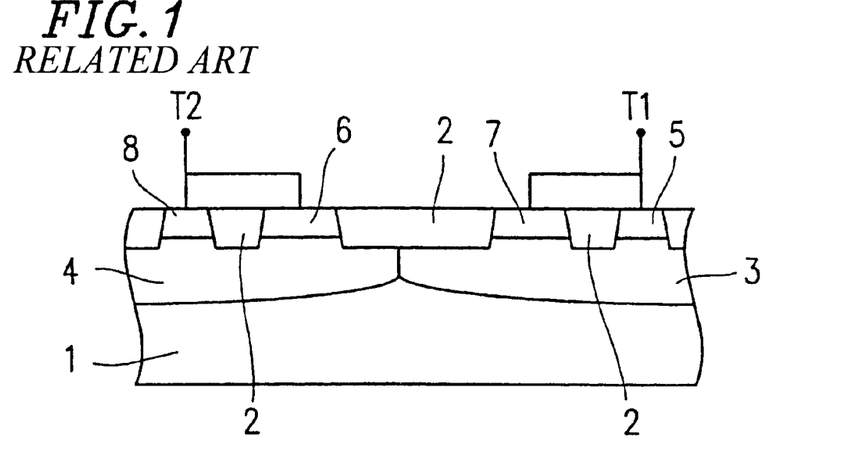
FIG. 1 is a cross-sectional view showing a fundamental configuration of a thyristor.

FIG. 1 is a cross-sectional view showing a fundamental thyristor taken along a normal direction to a substrate surface. This fundamental thyristor includes a P-type silicon substrate 1. A low-concentration N-type semiconductor region 3 and a low-concentration P-type semiconductor region 4 are provided side by side in a horizontal direction on the silicon substrate 1. A high-concentration N-type semiconductor region 5 and a high-concentration P-type semiconductor region 7 are provided on the low-concentration N-type semiconductor region 3 and are separated by an isolation region 2. A high-concentration N-type semiconductor region 6 and a high-concentration P-type semiconductor region 8 are provided on the low-concentration P-type semiconductor region 4 and are separated by the isolation region 2. The isolation region 2 is also provided on an interface between the low-concentration N-type semiconductor region 3 and the low-concentration P-type semiconductor region 4 to separate the high-concentration P-type semiconductor region 7 and the high-concentration N-type semiconductor region 6 from each other.

Thus, the thyristor shown in FIG. 1 has a P-N-P-N structure. An anode terminal T1 is connected to the high-concentration N-type semiconductor region 5 and the high-concentration P-type semiconductor region 7, and a cathode terminal T2 is connected to the high-concentration N-type semiconductor region 6 and the high-concentration P-type semiconductor region 8. Note that the high-concentration P-type semiconductor region 7 and the high-concentration N-type semiconductor region 6 which are separated by the isolation region 2 are referred to as an anode and a cathode, respectively.

Figure 2:
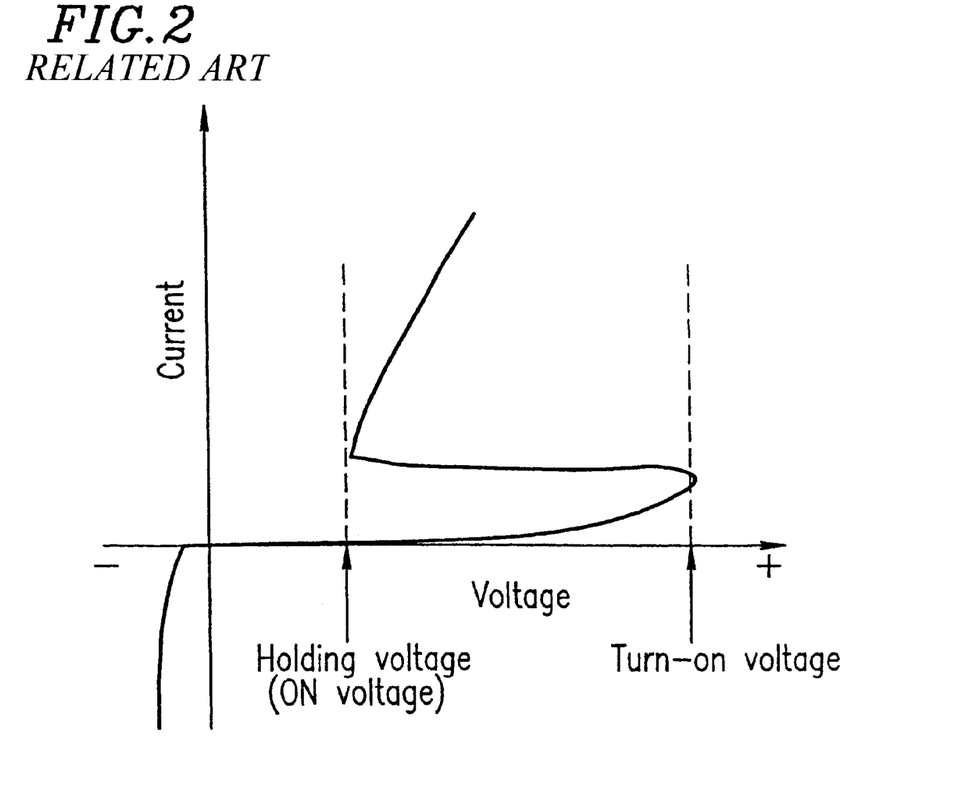
FIG. 2 is a graph showing the current-voltage characteristics of a typical thyristor.

FIG. 2 is a graph showing the current-voltage characteristics of a typical thyristor where the voltage applied to the anode is changed while the cathode is set to be held at a reference potential (0 V). As shown in FIG. 2, the thyristor can allow a large amount of current to flow therethrough with an increase in voltage in the positive direction once it is switched ON. The thyristor can also allow a large amount of current to flow therethrough with an increase in voltage in the negative direction due to the forward direction characteristics of the PN junction. Therefore, thyristors are often used as static electricity protection circuits.

Note electrostatic discharge is caused by combining any two terminals having positive and negative polarities. Therefore, the static electricity protection circuit needs to be capable of allowing a sufficient amount of discharge current to flow between any two terminals.

Figure 3:
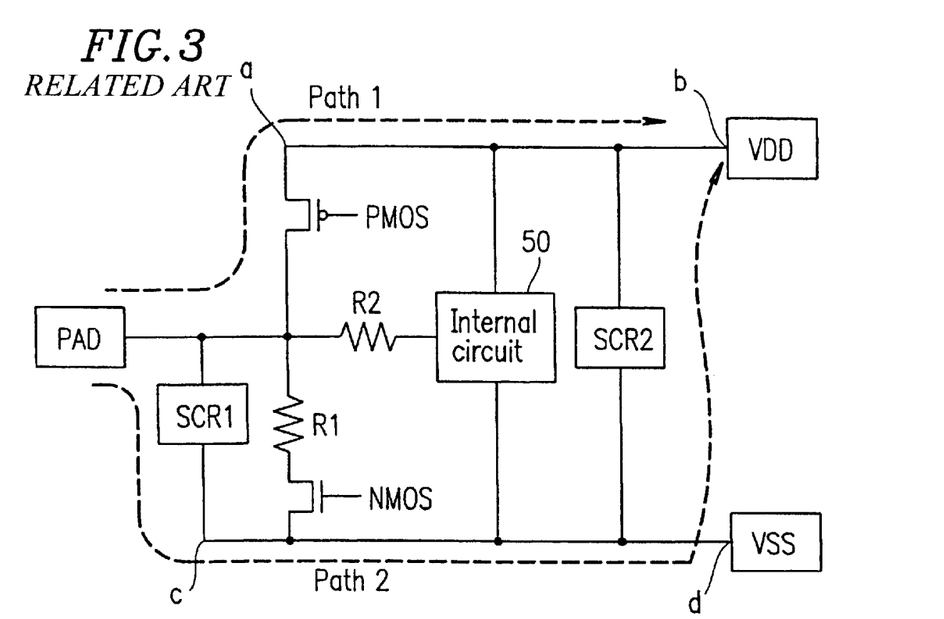
FIG. 3 is a circuit diagram showing a configuration of a semiconductor device including a conventional static electricity protection circuit.

A conventional protection circuit for such electrostatic discharge will be described with reference to FIG. 3. FIG. 3 is a block diagram showing a semiconductor device including a conventional static electricity protection circuit. In this semiconductor device, a protection circuit is connected to an external input-output terminal PAD. In the protection circuit, a P-type MOS transistor PMOS is provided between the external input-output terminal PAD and a power supply terminal VDD, and a resistance portion R1 and an N-type MOS transistor NMOS are provided between the P-type MOS transistor PMOS and a ground terminal VSS. A power supply line is represented by line a-b in FIG. 3, and a ground line is represented by line c-d in FIG. 3.

A first thyristor SCR1 is provided between the external input-output terminal PAD and the ground line c-d. The anode portion of the first thyristor SCR1 is connected to the external input-output terminal PAD, and the cathode portion is connected to the ground line c-d. A second thyristor SCR2 is provided between the power supply line a-b and the ground line c-d. The anode portion of the second thyristor SCR2 is connected to the power supply line a-b, and the cathode portion is connected to the ground line c-d.

An internal circuit 50 is connected via a resistance portion R2 to the external input-output terminal PAD. The internal circuit 50 is also connected to the power supply terminal VDD and the ground terminal VSS.

In the exemplary semiconductor device shown in FIG. 3, the P-type MOS transistor PMOS functions as an output transistor. If the P-type MOS transistor PMOS functions as an input transistor, typically, the gate thereof is connected to the internal circuit 50 side of the resistance portion R2.

The resistance value of the resistance portion R1 connected to the N-type MOS transistor NMOS is about 10Ω, which is similar to the resistance value of a typical resistance portion connected to an N-type MOS transistor. In the semiconductor device shown in FIG. 3, a connection node between the P-type MOS transistor PMOS and the N-type MOS transistor NMOS is connected via the resistance portion R2 to an input portion of the internal circuit 50. Alternatively, the internal circuit 50 may be connected via the resistance portion R2 between the resistance portion R1 and the N-type MOS transistor NMOS.

The resistance portion R2 connected to the input side of the internal circuit 50 is provided so as to protect the gate of the internal circuit 50, and has a resistance value of about 150Ω to about 400Ω. If the external input-output terminal PAD is used as an input terminal of the internal circuit 50, the resistance portion R2 may be provided between the connection node between the P-type MOS transistor PMOS and the N-type MOS transistor NMOS, and the external input-output terminal PAD. If the external input-output terminal PAD is used as an output terminal of the internal circuit 50, an output current cannot be obtained and therefore the resistance portion R2 cannot be provided between the power supply terminal VDD and the external input-output terminal PAD.

As described above, a thyristor has a high capability of discharging currents in both positive and negative directions. Therefore, in the semiconductor device shown in FIG. 3, the second thyristor SCR2 functions as a protection element against electrostatic discharge conducted between the power supply terminal VDD and the ground terminal VSS, so that the semiconductor device exhibits a high level of static electricity endurance. The first thyristor SCR1 functions as a protection element against electrostatic discharge conducted between the external input-output terminal PAD and the ground terminal VSS, so that the semiconductor device exhibits a high level of static electricity endurance.

Figure 4:
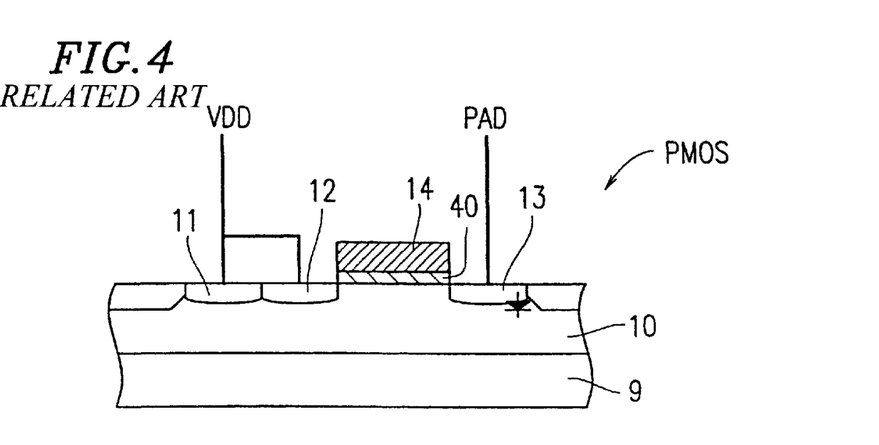
FIG. 4 is a cross-sectional view showing a configuration of a P-type MOS transistor.

Next, electrostatic discharge conducted between the external input-output terminal PAD and the power supply terminal VDD will be described. FIG. 4 is a cross-sectional view showing a configuration of the P-type MOS transistor PMOS of the semiconductor device shown in FIG. 3. The P-type MOS transistor PMOS shown in FIG. 4 includes a P-type silicon substrate 9. A low-concentration N-type semiconductor region 10 is provided on the P-type silicon substrate 9. A gate polysilicon 14 is provided via a gate oxide film 40 on the low-concentration N-type semiconductor region 10. A high-concentration P-type semiconductor region 13 and a high-concentration P-type semiconductor region 12 are provided on the low-concentration N-type semiconductor region 10, interposing the gate polysilicon 14 and the gate oxide film 40. A high-concentration N-type semiconductor region 11 is provided to be adjacent the high-concentration P-type semiconductor region 12. The high-concentration P-type semiconductor region 13 is connected to the external input-output terminal PAD. The high-concentration P-type semiconductor region 12 and the high-concentration N-type semiconductor region 11 are connected to the power supply terminal VDD.

In the thus-constructed P-type MOS transistor PMOS, a parasitic diode is present at a junction between the high-concentration P-type semiconductor region 13 connected to the external input-output terminal PAD and the low-concentration N-type semiconductor region 10.

Figure 5:
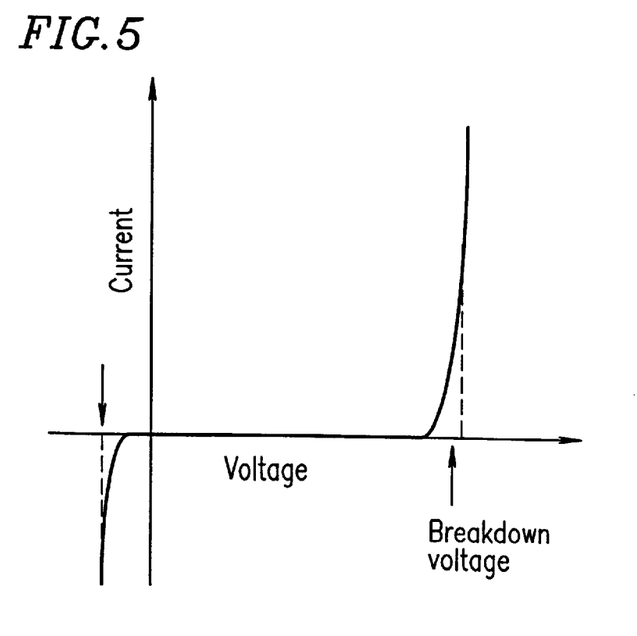
FIG. 5 is a graph showing the current-voltage characteristics of path 1 shown in FIG. 3.

Since a parasitic diode is present in the P-type MOS transistor PMOS, a portion of the semiconductor device shown in FIG. 3 represented by path 1 (from the external input-output terminal PAD to the power supply terminal VDD via the P-type MOS transistor PMOS) has current-voltage characteristics as shown in FIG. 5 when the potential of the power supply terminal VDD is changed where the external input-output terminal PAD is held at 0 V. Such characteristics are of a diode.

Next, path 2 in the semiconductor device shown in FIG. 3 from the external input-output terminal PAD to the ground terminal VSS will be described. When the potential of the power supply terminal VDD is increased in the positive direction with respect to the external input-output terminal PAD, the first thyristor SCR1 allows a large amount of current to flow therethrough due to a significantly small potential difference of about 0.7 V. Therefore, a major part of the potential difference is applied to the second thyristor SCR2. As a result, the current-voltage characteristics of the portion represented by path 2 are substantially the same as what is seen in the positive direction side of the graph of FIG. 2.

Thus, when the electrostatic discharge phenomenon occurs in which the potential of the power supply terminal VDD is increased in the positive direction where the external input-output terminal PAD is held at 0 V, a discharge current flows through path 1 or path 2 shown in FIG. 3.

A fundamental thyristor as shown in FIG. 1 fabricated by a CMOS process does not have a particular trigger structure. A turn-on voltage (a voltage from which a thyristor begins exhibiting a negative resistance) of such a fundamental thyristor is determined by a breakdown voltage of the low-concentration N-type semiconductor region 3 and the low-concentration P-type semiconductor region 4, and has a value of several tens of volts. There is a known thyristor having a trigger structure which can be fabricated without an additional process to a CMOS process, and in which the turn-on voltage can be lowered. An example of such a thyristor is shown in FIG. 7.

Figure 7:
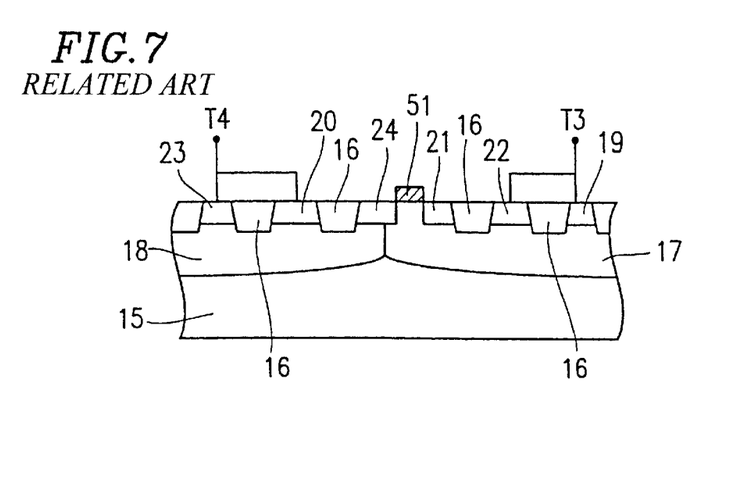
FIG. 7 is a cross-sectional view showing a configuration of a thyristor having a trigger structure.

In the thyristor shown in FIG. 7, a low-concentration N-type semiconductor region 17 and a low-concentration P-type semiconductor region 18 are provided side by side in a horizontal direction on a P-type silicon substrate 15. High-concentration N-type semiconductor regions 19, 21, and a high-concentration P-type semiconductor region 22 are provided on the low-concentration N-type semiconductor region 17 and are isolated from one another by an isolation region 16. High-concentration N-type semiconductor region 20, and high-concentration P-type semiconductor regions 23 and 24 are provided on the low-concentration P-type semiconductor region 18, and are isolated from one another by the isolation region 16. The high-concentration P-type semiconductor region 24 penetrates from the low-concentration N-type semiconductor region 17 into the low-concentration P-type semiconductor region 18. A gate silicon 51 is provided on the low-concentration N-type semiconductor region 17 between the high-concentration P-type semiconductor region 24 and the high-concentration N-type semiconductor region 21 provided in the low-concentration N-type semiconductor region 17. An anode terminal T3 is connected to the high-concentration N-type semiconductor region 19 and the high-concentration P-type semiconductor region 22, and a cathode terminal T4 is connected to the high-concentration N-type semiconductor region 20 and the high-concentration P-type semiconductor region 23.

In such a thyristor, the high-concentration P-type semiconductor region 24 is provided at a junction portion between the low-concentration P-type semiconductor region 18 and the low-concentration N-type semiconductor region 17. Voltage endurance between the high-concentration P-type semiconductor region 24 and the low-concentration N-type semiconductor region 17 is lower than voltage endurance between the low-concentration P-type semiconductor region 18 and the low-concentration N-type semiconductor region 17. Therefore, the junction portion between the high-concentration P-type semiconductor region 24 and the low-concentration N-type semiconductor region 17 serves as a trigger. However, also in this thyristor, the turn-on voltage is about 10 to 20 V. It is difficult to reduce the turn-on voltage to lower than or equal to the breakdown voltage of the junction portion between the high-concentration P-type semiconductor region 24 and the low-concentration N-type semiconductor region 17.

Therefore, even when such a thyristor is used as a part of a static electricity protection circuit in the semiconductor device shown in FIG. 3, if an electrostatic discharge phenomenon occurs in which the potential of the power supply terminal VDD is increased in the positive direction where the potential of the external input-output terminal PAD is referenced as 0 V, most current actually flows through path 1 but not path 2 as shown in FIG. 3, so that current is concentrated into the P-type MOS transistor PMOS. As a result, the voltage endurance of the P-type MOS transistor PMOS against electrostatic discharge determines the voltage endurance of the whole circuit against electrostatic discharge.

In the P-type MOS transistor PMOS, there is a steep portion in the concentration gradient in a channel direction of the transistor. Therefore, discharge current tends to be locally concentrated and the endurance of the P-type MOS transistor PHOS against static electricity damage is likely to be reduced. Such a tendency of discharge current to be locally concentrated causes the source/drain diffused resistance and the gate conductor resistance of the P-type MOS transistor PMOS to be reduced. Therefore, if the P-type MOS transistor PMOS includes metal silicide provided on the high-concentration P-type semiconductor region, such a tendency is more significant. In this case, the endurance against static electricity damage is likely to be further reduced.

Japanese Laid-Open Publication No. 10-70238 discloses a static electricity protection circuit in which a first thyristor is provided between an input-output terminal and a ground terminal, and a second thyristor is provided between a power supply terminal and a ground terminal. Even in this static electricity protection circuit, when an ON voltage for switching a P-type MOS transistor ON is reduced, current is not discharged through path including the first and second thyristors, but discharge current is concentrated into the P-type MOS transistor. As a result, the voltage endurance against static electricity damage is likely to be reduced.

SUMMARY OF THE INVENTION

According to an aspect of the present invention, a protection circuit for protecting a semiconductor device from being damaged due to an excessively high applied voltage, includes a P-type MOS transistor provided between an external input-output terminal and a power supply line, an N-type MOS transistor provided between the P-type MOS transistor and a ground line, a first thyristor provided between the external input-output terminal and the ground line, an anode portion thereof being connected to the external input-output terminal side, and a cathode portion thereof being connected to the ground line, a second thyristor provided between the power supply line and the ground line, an anode portion thereof being connected to the power supply line, and a cathode portion thereof being connected to the ground line, and a resistance portion provided at a predetermined location of a conductor extending from a branch node between the P-type MOS transistor and the N-type MOS transistor to the power supply line via the P-type MOS transistor.

In one embodiment of this invention, the resistance value of the resistance portion is a value such that when a potential of a power supply terminal is increased in a positive direction with respect to the external input-output terminal, a first minimum value of a voltage causing a first path to be damaged, the first path ranging from the external input-output terminal to the power supply terminal via the P-type MOS transistor, the resistance portion, and the power supply line, is greater than a second minimum value of a voltage causing a second path to exhibit negative resistance, the second path ranging from the external input-output terminal to the power supply terminal via the first thyristor, the ground line, the second thyristor, and the power supply line.

In one embodiment of this invention, each of the first thyristor and the second thyristor has a trigger structure.

In one embodiment of this invention, a conductor including first and second conductor layers connected via a through hole, is connected to the P-type MOS transistor. The through hole forms the resistance portion.

In one embodiment of this invention, the resistance portion is formed of a high impurity concentration region provided in a low impurity concentration region provided on a semiconductor substrate. The conductivity type of the high impurity concentration region is opposite to the conductivity type of the low impurity concentration region.

In one embodiment of this invention, the resistance portion is formed of a low impurity concentration region provided in a semiconductor substrate.

In one embodiment of this invention, a pair of high impurity concentration regions are provided on the low impurity concentration region. The pair of high impurity concentration regions are separated by an isolation region; the conductivity type of the high impurity concentration regions is the same as that of the low impurity concentration region. A conductor is connected to each of the pair of high impurity concentration regions.

In one embodiment of this invention, the resistance portion is formed of a metal conductor ranging from the external input-output terminal to the power supply terminal via the P-type MOS transistor and the power supply line.

According to another aspect of the present invention, a semiconductor device including an external input-output terminal is provided, in which the protection circuit of the present invention is connected to the external input-output terminal.

In one embodiment of this invention, the semiconductor device further includes one or more external input-output terminals, in which a protection circuit of the present invention is connected to each external input-output terminal, and the resistance portion is formed of the resistance of the power supply line connected to each protection circuit.

Thus, the invention described herein makes possible the advantages of providing: a protection circuit including a thyristor for preventing static electricity damage in a semiconductor device fabricated by a CMOS process, such as a semiconductor integrated circuit, in which a discharge path including a thyristor is provided to avoid concentration of current into a P-type MOS transistor serving as an input-output portion, whereby static electricity damage of the semiconductor device is effectively prevented; a semiconductor device including the same; a protection circuit used in a semiconductor device fabricated by a CMOS process, in which static electricity damage of the semiconductor device is effectively prevented without performing any particular additional process step; and a semiconductor device including the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 6:
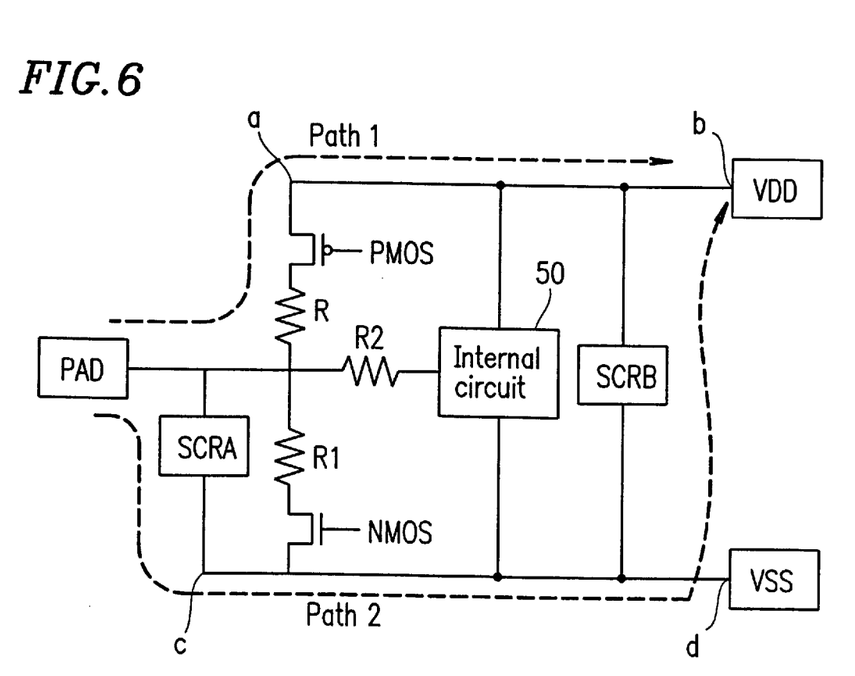
FIG. 6 is a circuit diagram showing a configuration of a semiconductor device including a protection circuit according to the present invention.

FIG. 6 is a schematic cross-sectional view showing a semiconductor device including a static electricity protection circuit according to the present invention. In this semiconductor device, similar to the semiconductor device shown in FIG. 3, a protection circuit is provided to an external input-output terminal PAD. The protection circuit includes a P-type MOS transistor PMOS provided between an external input-output terminal PAD and a power supply terminal VDD, and a resistance portion R between the P-type MOS transistor PMOS and the external input-output terminal PAD. In addition, a resistance portion R1 and an N-type MOS transistor NMOS are provided between the resistance portion R and a ground terminal VSS. Note that in FIG. 6, a power supply line is represented by line a-b, and a ground line is represented by line c-d Further, a first thyristor SCRA is provided between the external input-output terminal PAD and the ground line where the anode portion is connected to the external input-output terminal PAD and the cathode portion is connected to the ground line c-d. A second thyristor SCRB is provided between the power supply line a-b and the ground line c-d where the anode portion is connected to the power supply line a-b and the cathode portion is connected to the ground line a-d.

An internal circuit 50 is connected via a resistance portion R2 to the external input-output terminal PAD. This internal circuit 50 is also connected to the power supply terminal VDD and the ground terminal VSS.

In the protection circuit in the semiconductor device shown in FIG. 6, a thyristor having a trigger structure shown in FIG. 7 is used as each of the first thyristor SCRA and the second thyristor SCRB. A semiconductor impurity region in each of the thyristors SCRA and SCRB is formed by a step as used in forming an impurity region in a CMOS transistor including a P-type MOS transistor PMOS and an N-type MOS transistor NMOS, whereby an additional process step is not particularly required.

Further, in the protection circuit in the semiconductor device shown in FIG. 6, the resistance portion R is joined to a conductor extending from a branch node between the P-type MOS transistor PMOS and the N-type MOS transistor NMOS through the P-type MOS transistor PMOS to the power supply line a-b. In this example, the resistance portion R is provided between the P-type MOS transistor PHOS and the N-type MOS transistor NMOS.

In such a protection circuit, using the first and second thyristors SCRA and SCRB fabricated by a CMOS process, the value of electrostatic discharge current flowing through the P-type MOS transistor PMOS connected to the external input-output terminal PAD is limited. Therefore, a discharge path including the first and second thyristors SCRA and SCRB allows achievement of a sufficient level of static electricity endurance. This protection circuit will be described in more detail below.

In the semiconductor device shown in FIG. 6, it is assumed that positive charge is discharged into the power supply terminal VDD where the potential of the external input-output terminal PAD is at a reference potential (0 V). In this case, there are two current discharge paths: a first discharge path 1 is from the external input-output terminal PAD to the power supply terminal VDD via the resistance portion R, a parasitic diode of the P-type MOS transistor PHOS, and the power supply line a-b; and a second discharge path 2 is from the external input-output terminal PAD to the power supply terminal VDD via the first thyristor SCRA, the ground line c-d, the second thyristor SCRB, and the power supply line. These paths 1 and 2 are arranged in parallel, the ratio of currents flowing through paths 1 and 2 can be modified by changing the resistance value of the resistance portion R provided at the P-type MOS transistor PMOS side.

When a minimum voltage causing a circuit portion including the P-type MOS transistor PMOS and the resistance portion R to be damaged by electrostatic discharge (hereinafter a minimum voltage causing damage is also referred to as a damage voltage) is lowered to a value smaller than the turn-on voltage of path 2 including the second thyristor SCRB by reducing the resistance value of the resistance portion R, current flow is concentrated into path 1 and therefore the P-type MOS transistor PMOS is damaged. Thus, the damage voltage of the P-type MOS transistor PMOS can determine the voltage endurance against electrostatic discharge.

When the damage voltage of the portion including the P-type MOS transistor PMOS and the resistance portion R is raised to a value greater than the turn-on voltage of path 2 including the second thyristor SCRB by increasing the resistance value of the resistance portion R, current flow is concentrated into path 2 and therefore discharge is conducted through the second thyristor SCRB which is designed to have a high level of endurance against electrostatic discharge. Therefore, the voltage endurance of the protection circuit against electrostatic discharge can be enhanced.

In this example, the potential of the external input-output terminal PAD is at a reference potential (0 V) and positive charge is discharged to the power supply terminal VDD. Electrically equivalent to this, negative charge is discharged to the external input-output terminal PAD where the potential of the power supply terminal VDD is at a reference potential (0 V). Note that when negative charge is discharged to the power supply terminal VDD where the potential of the external input-output terminal PAD is at a reference potential (0 V), a current flows through the parasitic diode of the P-type MOS transistor PMOS in the forward direction of the PN junction, whereby current concentration is not likely to occur and therefore a high level of damage endurance can be obtained.

The resistance portion R may be made of a conductor (e.g., metal) connected to the P-type MOS transistor PMOS, for example.

Figure 10:
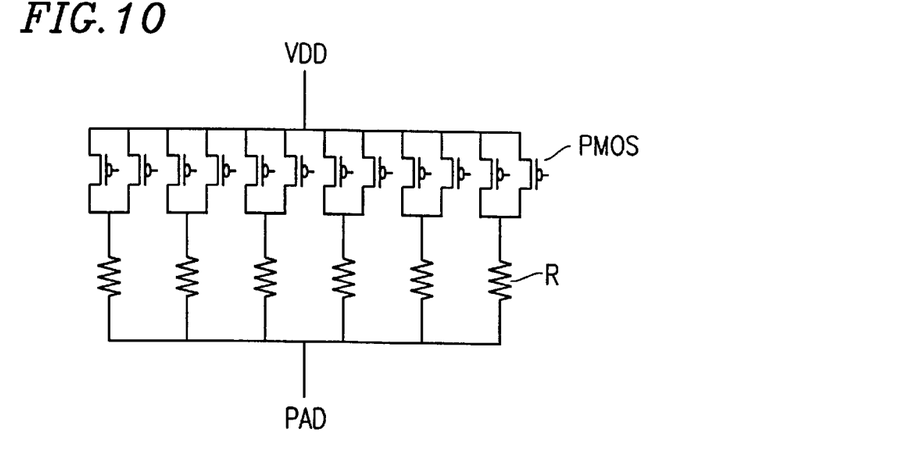
FIG. 10 is a circuit diagram showing a configuration of resistance portions and PMOS transistors in a protection circuit.

FIG. 10 shows details of the P-type MOS transistor PMOS and the resistance portion R in the protection circuit shown in FIG. 6. The P-type MOS transistor PMOS includes 12 P-type MOS transistors (indicated by PMOS in FIG. 10) each having a width of 34 $\mu$m which are arranged in parallel, so that the width of the entire P-type MOS transistor PMOS is 408 $\mu$m. A resistance portion (indicated by R in FIG. 10) is connected to each pair of P-type MOS transistors PMOS.

A metal conductor connected to the drain of each P-type MOS transistor PMOS includes first and second conductor layers which are connected to each other via a through hole. The resistance portion R is formed of the resistance generated in the through hole.

Figure 8:
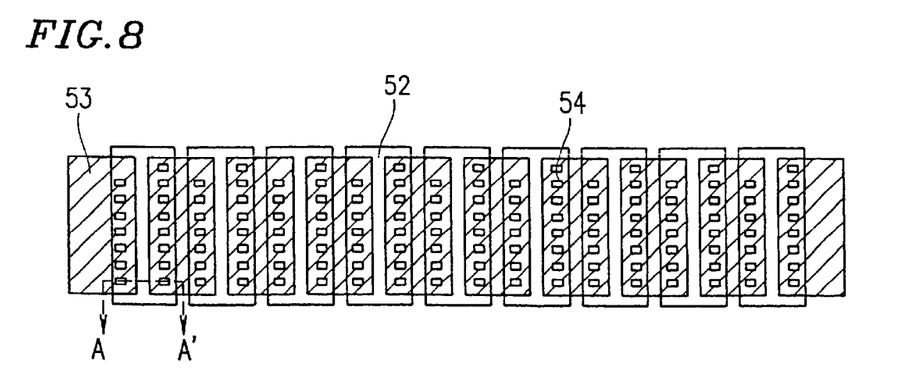
FIG. 8 is a schematic plan view showing a configuration of conductors including a resistance portion of a protection circuit.
Figure 9:
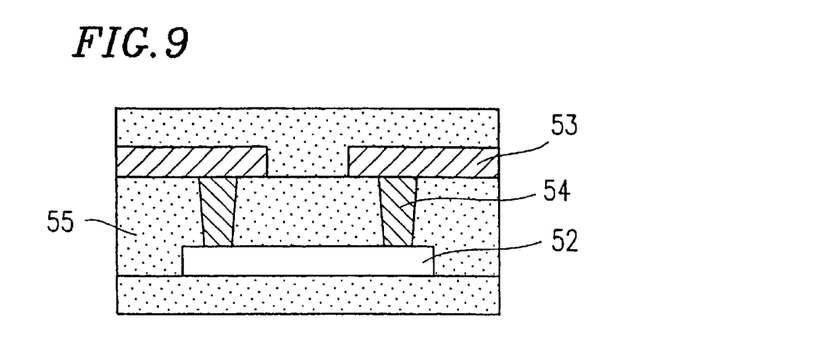
FIG. 9 is a cross-sectional view taken along line A–A' in FIG. 8.

FIG. 8 is a schematic plan view showing the metal conductor connected to the drain of the P-type MOS transistor PMOS. FIG. 9 is a cross-sectional view of the metal conductor taken along line A–A' of FIG. 8. Nine first conductor layers 52 are equally spaced in parallel on a semiconductor layer, and are covered with an insulating layer 55. Ten second conductor layers 53 are provided on the insulating layer 55. The leftmost and rightmost second conductor layers 53 are placed at peripheries of the leftmost and rightmost first conductor layers 52, respectively. Each of the other second conductor layers 53 is positioned between a pair of adjacent first conductor layers 52 while overlapping the periphery portions of the first conductor layers 52.

Each of the second conductor layers 53 provided between a pair of first conductor layers 52 is electrically connected via seven through holes 54 to one of the first conductor layers 52 and via eight through holes 54 to the other first conductor layer 52.

The metal conductor including the nine first conductor layers 52 and the ten second conductor layers 53 electrically connected to each other via the through holes 54 is connected in series to each drain of a pair of P-type MOS transistors PMOS connected in parallel. Therefore, each of the six metal conductors is connected in series to each of the pair of P-type MOS transistor PMOS.

The resistances of all of the through holes 54 connected to the first and second conductor layers 52 and constitute the resistance portion R.

The resistance value of the resistance portion R is calculated in the following manner. The turn-on voltage of path 2 shown in FIG. 6 is measured to be about 17 V using an evaluation circuit. The damage current and voltage of the P-type MOS transistor PMOS are 2.4 A and 12.8 V, respectively. Therefore, a resistance value required for the resistance portion R is calculated to be as follows:

(17 V−12.8 V)/2.4 A≅1.8Ω.

In this case, the resistance value of the resistance portion R is set to be 2.8Ω by taking a suitable resistance value margin into consideration.

Each through hole 54 connecting a pair of the first and second conductor layers 52 and 53 of metal conductor has a diameter of about 0.26 $\mu$m and a resistance value of about 7Ω.

Therefore, in one metal conductor connected to a pair of P-type MOS transistor PMOS in parallel, the resistance value of the entirety of the through holes 54 is calculated to be as follows:

7Ω/7+7Ω/8≅1.88Ω.

The resistance value of the metal conductor including the nine first conductor layers 52 is calculated to be as follows:

1.88Ω×9≅16.9Ω.

As shown in FIG. 10, since the six resistance portions R are connected in parallel, each resistance portion R has a resistance value calculated to be as follows:

16.9Ω×⅙≅2.8Ω.

Figure 11:
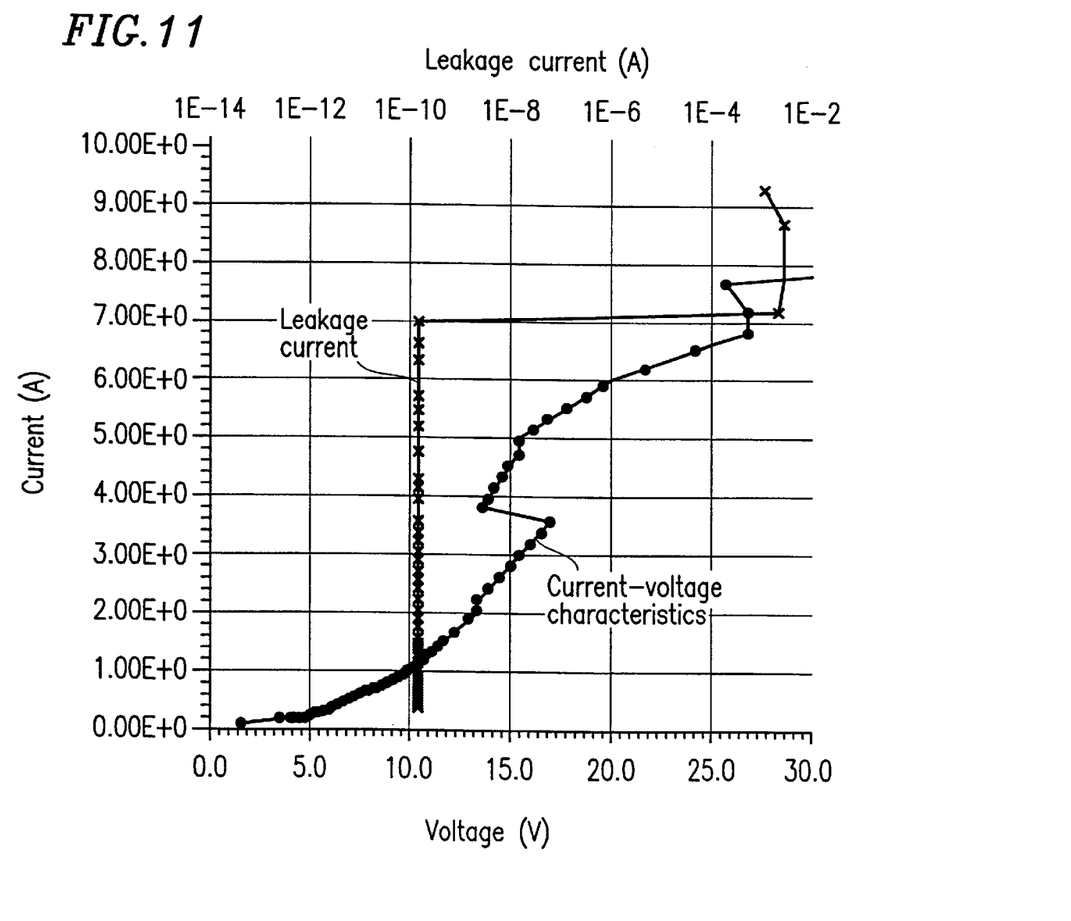
FIG. 11 is a graph showing the current-voltage characteristics of the semiconductor device of the present invention shown in FIG. 6.

FIG. 11 is a graph showing the current-voltage (I–V) characteristics of the semiconductor device of this example in which the resistance portion R is made of a conductor. The graph shows the I–V characteristics of path 2 shown in FIG. 6 and leakage current of path 1 shown in FIG. 6, when a pulse voltage is applied between the ground terminal VSS and the external input-output terminal PAD. In this graph, a snapback property is found which indicates the ON state of a thyristor, suggesting that path 2 shown in FIG. 6 functions as an effective protection circuit. The leakage current is 1×10$^{-10}$ A until the applied voltage reaches 27 V, and path 1 does not suffer from damage.

Figure 12:
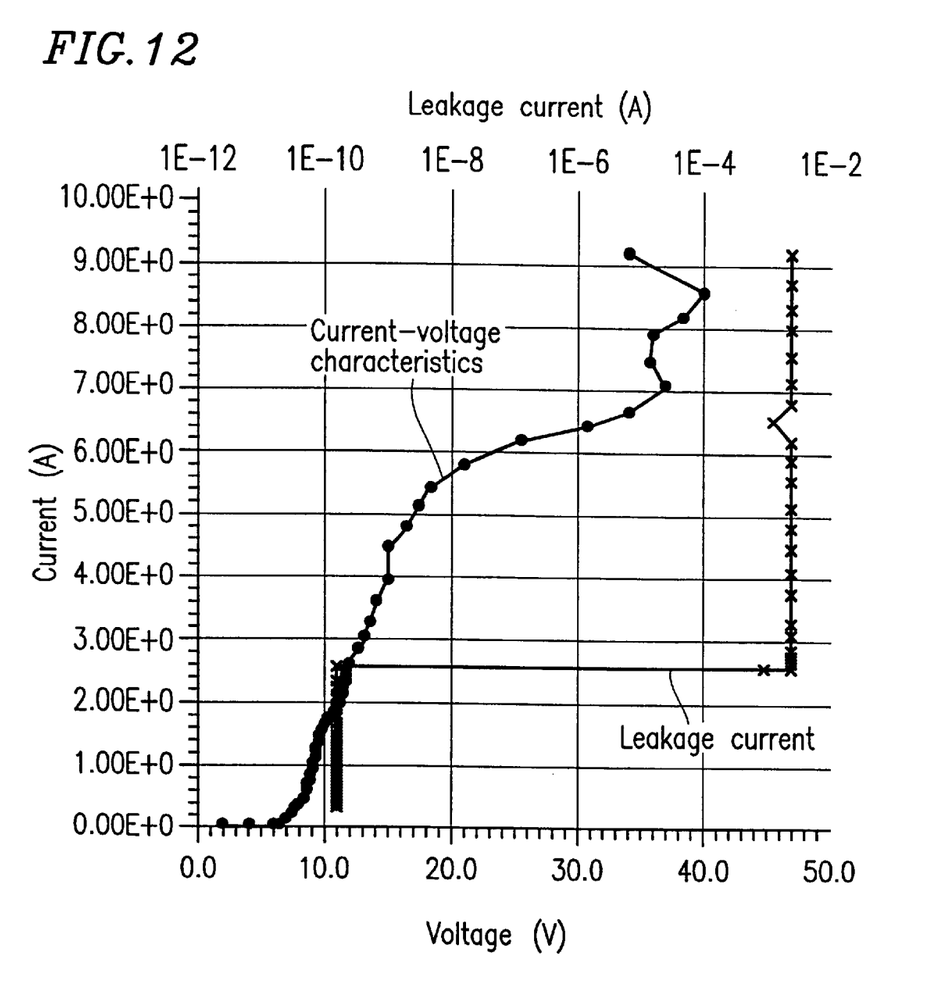
FIG. 12 is a graph showing the current-voltage characteristics of the conventional semiconductor device shown in FIG. 3.

FIG. 12 is a graph showing the current-voltage (I–V) characteristics of the conventional semiconductor device shown in FIG. 3. The graph also shows the I–V characteristics of path 2 shown in FIG. 3 and leakage current of path 1 shown in FIG. 3, when a pulse voltage is applied between the ground terminal VSS and the external input-output terminal PAD. In this graph, a snapback property is not seen. It is found that current flows through a parasitic diode of the P-type MOS transistor PHOS thus causing damage. When the applied voltage is 12 V, leakage current is significantly changed. At that time, path 1 is considered to be damaged.

The semiconductor device of the example of the present invention shown in FIG. 6 and the conventional semiconductor device shown in FIG. 3 were subjected to a Machine model test which is an ESD (Electrostatic Discharge) test in which a voltage is applied to the external input-output terminal PAD in the negative direction where the power supply terminal VCC is used as a reference. The results are shown in Table 1. Note that in the machine model test, electric charge stored in a capacitor of 200 pF is discharged without a resistor. Samples 1 to 3 are chips having the same circuit configuration fabricated by the same process.

TABLE 1

|  | Sample 1 | Sample 2 | Sample 3 |
| --- | --- | --- | --- |
| Example 1 | 350 V | 350 V | 350 V |
| Conventional Example | 250 V | 250 V | 200 V |

According to Table 1, the semiconductor device of this example has significantly improved electrostatic discharge endurance compared to the conventional semiconductor device.

In this example, the resistance portion R is provided between a branch node between the P-type MOS transistor PMOS and the N-type MOS transistor NMOS, and the P-type MOS transistor PMOS. Alternatively, the resistance portion R may be provided between the P-type MOS transistor PMOS and the power supply terminal VDD. Further, the resistance portion R may be divided and provided on opposite sides of the P-type MOS transistor PMOS. The greater the resistance value of the resistance portion R, the more the electrostatic discharge endurance is improved. However, when the resistance value of the resistance portion R is excessively high, output current is decreased. Preferably, the resistance value of the resistance portion R is about 10Ω or less.

EXAMPLE 2

In Example 2 of the present invention, a high impurity concentration region is used to form the resistance portion R of the semiconductor device shown in FIG. 6.

Figure 13A:
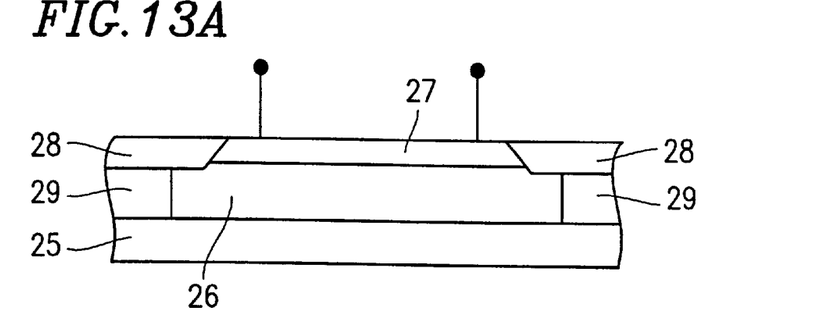
FIG. 13A is a cross-sectional view showing another exemplary resistance portion in a protection circuit.
Figure 13B:
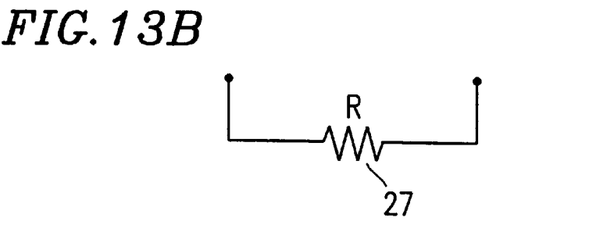
FIG. 13B is an equivalent circuit diagram of the resistance portion shown in FIG. 13A.

FIG. 13A is a cross-sectional view showing a part of the protection circuit of the semiconductor device shown in FIG. 6 in which the resistance portion R is provided. In the protection circuit, a low-concentration N-type semiconductor region 26 and a low-concentration P-type semiconductor region 29 are provided side by side in a horizontal direction on a P-type silicon substrate 25. In the low-concentration N-type semiconductor region 26, a high-concentration P-type semiconductor region 27 is formed by impurity diffusion, which serves as the resistance portion R. The high-concentration P-type semiconductor region 27 as the resistance portion R is separated from other regions by an isolation region 28. FIG. 13B is a diagram showing an equivalent circuit of the resistance portion R.

As described above, when the high-concentration P-type semiconductor region 27 is provided as the resistance portion R and a metal silicide (not shown) is provided on a surface of the high-concentration P-type semiconductor region 27, the resistance portion R having a resistance value of 2.8Ω which is substantially the same value as that of Example 1 can be provided if the high impurity concentration region 27 has a width of 25 $\mu$m and a length of 14 $\mu$m where the sheet resistance of the high impurity concentration region 27 is assumed to be 5Ω/□ (ohms per square).

EXAMPLE 3

In Example 3 of the present invention, a low impurity concentration region is used to form the resistance portion R of the semiconductor device shown in FIG. 6.

Figure 14A:
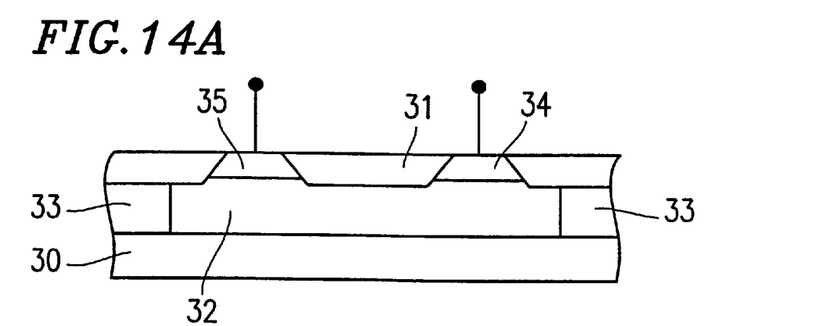
FIG. 14A is a cross-sectional view showing still another exemplary resistance portion in a protection circuit.
Figure 14B:
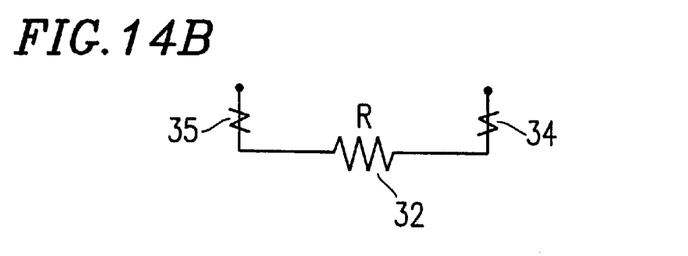
FIG. 14B is an equivalent circuit diagram of the resistance portion shown in FIG. 14A.

FIG. 14A is a cross-sectional view showing a part of the protection circuit of the semiconductor device shown in FIG. 6 in which the resistance portion R is provided. In the protection circuit, a low-concentration N-type semiconductor region 32 and a low-concentration P-type semiconductor region 33 are provided side by side in a horizontal direction on a P-type silicon substrate 30. The low-concentration N-type semiconductor region 32 serves as the resistance portion R. On the low-concentration N-type semiconductor region 32, high-concentration N-type (N$^+$) semiconductor regions 34 and 35 which are separated from each other by an isolation region 31 are provided as contact portions. Metal conductors are connected to the high-concentration N-type (N$^+$) semiconductor regions 34 and 35 (contact portions). Since the metal conductors are connected to the low-concentration N-type semiconductor region 32 via the high-concentration N-type (N$^+$) semiconductor regions 34 and 35 (contact portions), the contact resistance is not likely to be high. FIG. 14B is a diagram showing an equivalent circuit of the resistance portion R.

As described above, when the low-concentration N-type semiconductor region 32 is provided as the resistance portion R and a metal silicide (not shown) is provided on a surface of the low-concentration N-type semiconductor region 32, the resistance portion R having a resistance value of 2.8Ω which is substantially the same value as that of Example 1 can be provided if six resistance portions each having a width of 400 $\mu$m and a length of 16.8 $\mu$m are provided in parallel where the sheet resistance of the low impurity concentration region 32 is assumed to be 400Ω/□.

EXAMPLE 4

In Example 4 of the present invention, a metal conductor is used to form the resistance portion R in the semiconductor device shown in FIG. 6.

Figure 15:
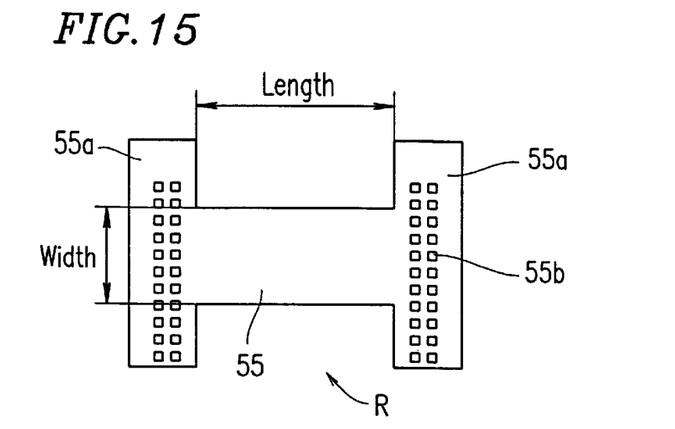
FIG. 15 is a schematic plan view showing yet another exemplary resistance portion in a protection circuit.

FIG. 15 is a plan view showing a part of the protection circuit of the semiconductor device shown in FIG. 6 in which the resistance portion R is provided. In the protection circuit, the resistance portion R is formed by using a metal conductor 55 extending from an external input-output terminal portion PAD to a power supply terminal VCC via a P-type MOS transistor PMOS and a power supply line. The metal conductor 55 includes a first conductor layer and a second conductor layer connected to the first conductor layer via a contact 55b.

The metal conductor 55 has a predetermined width and length, for example. On each of the opposite end portions of the metal conductor 55, a region 55a extending in a widthwise direction is provided so as to connect between the first conductor layer and the second conductor layer via the contact 55b. Each region 55a is provided in order to secure a sufficient number of contacts 55b connecting the first conductor layer and the second conductor layer. If the number of the contacts 55b is small, the contact resistance is large and therefore a predetermined resistance value is not likely to be obtained.

As described above, when a metal conductor is used to form the resistance portion R, the resistance portion R having a resistance value of 2.8Ω which is substantially the same value as that of Example 1 can be provided if the metal conductor 55 has a width of 2 $\mu$m and a length of 70 $\mu$m where the sheet resistance of the metal conductor layer is assumed to be 0.08Ω/□.

EXAMPLE 5

Figure 16A:
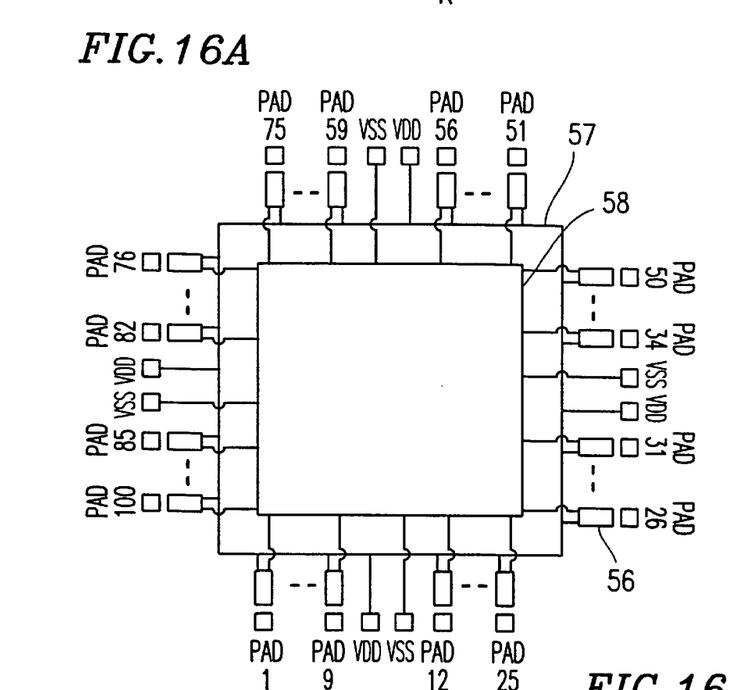
FIG. 16A is a layout diagram showing a configuration of a semiconductor chip of a semiconductor device according to the present invention.
Figure 16B:
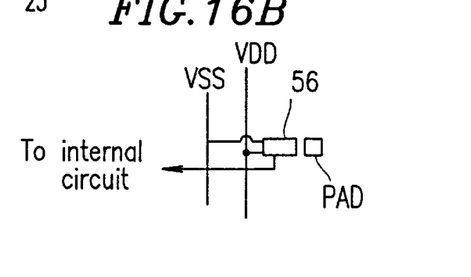
FIG. 16B is a detailed diagram showing a part of the semiconductor chip shown in FIG. 16A.

FIG. 16A is a schematic plan view showing a layout of a semiconductor chip according to the present invention. This semiconductor device includes a plurality of input-output terminals PAD. For each input-output terminal PAD, a protection circuit 56 is provided. Each protection circuit 56 is connected to an internal circuit of the semiconductor chip as shown in FIG. 16B. In this semiconductor chip, it is assumed that a damage voltage of path 1 is greater than a turn-on voltage of path 2 when the resistance value of a resistance portion R in each protection circuit 56 is 2.8Ω.

In the semiconductor chip, the internal circuit is provided within a square region of 4000 $\mu$m×4000 $\mu$m. A power supply line 57 is formed of a metal conductor having a width of 20 $\mu$m where the sheet resistance is 0.08Ω/□. A ground line 58 has a sufficient width so that the resistance of the line is negligible.

On the sides of the square region of area 4000 $\mu$m×4000 $\mu$m, external input-output terminals PAD1 to PAD9, PAD12 to PAD31, PAD34 to PAD56, PAD59 to PAD82, PAD85 to PAD100, four power supply terminals VDD, and four ground terminals VSS (a total of 100 terminals) are provided where 25 terminals are provided on each side and a distance between each terminal is 150 μm. The power supply terminals VCC and the ground terminals VDD are positioned about the middle of the respective sides.

Figure 17:
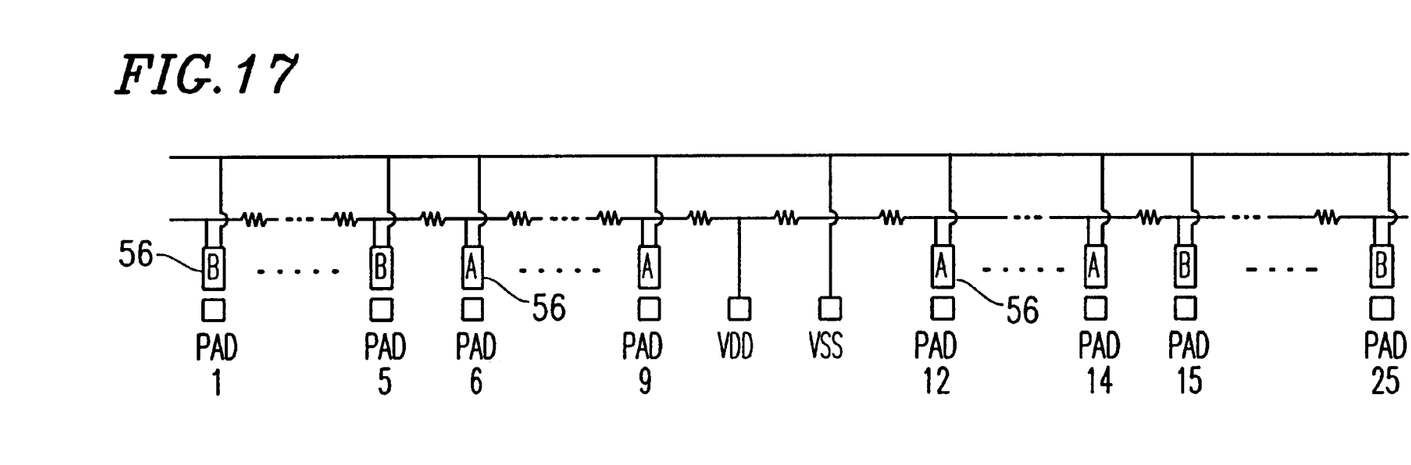
FIG. 17 is an enlarged view showing a major part of the semiconductor chip shown in FIG. 16A.

Therefore, the resistance value between each terminal of the power supply line 57 is 0.6Ω. As shown in FIG. 17, on each side of the square region, a protection circuit 56 (indicated by B in FIG. 17) is connected to an external input-output terminal Pad at the fifth position from the power supply terminal VDD and external input-output terminals Pad further than the fifth-positioned external input-output terminal PAD. Similar to Example 4, a resistance portion R having a resistance value of 2.8Ω or more is provided by utilizing the resistance of a power supply conductor.

In contrast, a resistance portion R having a resistance value of 2.8Ω or more is provided at the drain side of a P-type MOS transistor in a manner similar to any of Examples 1 to 3 in the protection circuit 56 (indicated by A in FIG. 17) connected to an external input-output terminal Pad placed from the power supply terminal VDD to the fourth position on each side of the square region.

For example, on a side of the square region, the nine external input-output terminals PAD1 to 9 are consecutively provided. The power supply terminal VDD and the ground terminal VSS are provided at the 10th and 11th positions, respectively. Subsequent to this, the external input-output terminals PAD12 to PAD25 are provided at the 12th to 25th positions. In this case, a resistance portion R having a resistance value of 2.8Ω or more is provided at the drain side of a P-type MOS transistor in the protection circuit 56 connected to each of the 6th to 9th and 12th to 14th external input-output terminals PAD.

The thus-constructed semiconductor chip was subjected to an ESD test according to a machine model test. As a result, in the presence of applied voltage of 300 V, all external input-output terminal portions PAD showed substantially no damage. The external input-output terminal portion PAD was damaged at an applied voltage of 350 V. In contrast, a semiconductor device including the protection circuit shown in FIG. 3 in which each thyristor has a trigger structure was fabricated under the same process conditions as those in the example of the present invention and was subjected to a similar ESD test. As a result, in the presence of an applied voltage of 250 V, it was confirmed that the external input-output terminal portion PAD was damaged.

As described above, the protection circuit of the present invention can prevent current concentration into a P-type MOS transistor and allows current to flow through a discharge path including a thyristor, whereby electrostatic damage can be prevented in a process for fabricating a semiconductor device having a minute structure.

Further, a protection circuit which can effectively prevent electrostatic damage can be produced in a CMOS process without any particular additional process steps.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A protection circuit for protecting a semiconductor device from being damaged due to an excessively high applied voltage, comprising:

a P-type MOS transistor provided between an external input-output terminal and a power supply line;

an N-type MOS transistor provided between the P-type MOS transistor and a ground line;

a first thyristor provided between the external input-output terminal and the ground line, an anode portion thereof being connected to the external input-output terminal side, and a cathode portion thereof being connected to the ground line;

a second thyristor provided between the power supply line and the ground line, an anode portion thereof being connected to the power supply line, and a cathode portion thereof being connected to the ground line; and a resistance portion provided at a predetermined location of a conductor extending from a branch node between the P-type MOS transistor and the N-type MOS transistor to the power supply line via the P-type MOS transistor so as to concentrate current flow in the protection through a path from the external input-output terminal to the power supply line including the first thyristor, ground line and second thyristor.

2. A protection circuit according to claim 1, wherein the resistance value of the resistance portion is a value such that when a potential of a power supply terminal is increased in a positive direction with respect to the external input-output terminal, a first minimum value of a voltage causing a first path to be damaged, the first path ranging from the external input-output terminal to the power supply terminal via the P-type MOS transistor, the resistance portion, and the power supply line, is greater than a second minimum value of a voltage causing a second path to exhibit negative resistance, the second path ranging from the external input-output terminal to the power supply terminal via the first thyristor, the ground line, the second thyristor, and the power supply line.

3. A protection circuit according to claim 1, wherein each of the first thyristor and the second thyristor has a trigger structure.

4. A protection circuit according to claim 1, wherein: a conductor including first and second conductor layers connected via a through hole, is connected to the P-type MOS transistor; and the through hole forms the resistance portion.

5. A protection circuit according to claim 1, wherein:

the resistance portion is formed of a high impurity concentration region provided in a low impurity concentration region provided on a semiconductor substrate, and the high impurity concentration region having a conductivity type opposite to a conductivity type of the low impurity concentration region.

6. A protection circuit according to claim 1, wherein the resistance portion is formed of a low impurity concentration region provided in a semiconductor substrate.

7. A protection circuit according to claim 6, wherein: a pair of high impurity concentration regions are provided on the low impurity concentration region; the pair of high impurity concentration regions are separated by an isolation region; the conductivity type of the high impurity concentration regions is the same as that of the low impurity concentration region; and a conductor is connected to each of the pair of high impurity concentration regions.

8. A protection circuit according to claim 1, wherein the resistance portion is formed of a metal conductor ranging from the external input-output terminal to the power supply terminal via the P-type MOS transistor and the power supply line.

9. A semiconductor device including an external input-output terminal, wherein a protection circuit according to claim 1 is connected to the external input-output terminal.

10. A semiconductor device including one or more external input-output terminals, wherein each external input-output terminal is connected to a corresponding protection circuit according to claim 1, and the resistance portion is formed of the resistance of the power supply line connected to each protection circuit.

11. A protection circuit for protecting a semiconductor device from being damaged due to an excessively high applied voltage, comprising:

a P-type MOS transistor provided between an external input-output terminal and a power supply line;

an N-type MOS transistor provided between the P-type MOS transistor and a ground line;

a first thyristor provided between the external input-output terminal and the ground line, an anode portion thereof being connected to the external input-output terminal side, and a cathode portion thereof being connected to the ground line;

a second thyristor provided between the power supply line and the ground line, an anode portion thereof being connected to the power supply line, and a cathode portion thereof being connected to the ground line; and a resistance portion provided at a predetermined location of a conductor extending from a branch node between the P-type MOS transistor and the N-type MOS transistor to the power supply line via the P-type MOS transistor, wherein the resistance portion is formed of a high impurity concentration region provided in a low impurity concentration region provided on a semiconductor substrate, and the high impurity concentration region having a conductivity type opposite to a conductivity type of the low impurity concentration region.

12. A semiconductor device including one or more external input-output terminals, wherein each external input-output terminal is connected to a corresponding protection circuit for protecting the semiconductor device from being damaged due to an excessively high applied voltage, each protection circuit comprising:

a P-type MOS transistor provided between an external input-output terminal and a power supply line;

an N-type MOS transistor provided between the P-type MOS transistor and a ground line;

a first thyristor provided between the external input-output terminal and the ground line, an anode portion thereof being connected to the external input-output terminal side, and a cathode portion thereof being connected to the ground line;

a second thyristor provided between the power supply line and the ground line, an anode portion thereof being connected to the power supply line, and a cathode portion thereof being connected to the ground line; and a resistance portion provided at a predetermined location of a conductor extending from a branch node between the P-type MOS transistor and the N-type MOS transistor to the power supply line via the P-type MOS transistor, and the resistance portion is formed of the resistance of the power supply line connected to each protection circuit.

\* \* \* \* \*